United States Patent [19]
Jung et al.

[11] Patent Number: 6,069,353
[45] Date of Patent: May 30, 2000

[54] POLYMER PHOTODETECTOR HAVING RESONANT WAVELENGTH CONTROL FUNCTION

[75] Inventors: Sang-Don Jung; O-Kyun Kwon; Tae-Hyoung Zyung, all of Daejeon, Rep. of Korea

[73] Assignee: Electronics and Telecommunications Research Institute, Daeieon, Rep. of Korea

[21] Appl. No.: 08/904,653

[22] Filed: Aug. 1, 1997

[30] Foreign Application Priority Data

Dec. 12, 1996 [KR] Rep. of Korea ............... 96-64946

[51] Int. Cl.$^7$ ............................................. H01L 31/0248
[52] U.S. Cl. ................................ 250/214.1; 250/372
[58] Field of Search ........................... 250/214.1, 214 R, 250/372; 313/506

[56] References Cited

U.S. PATENT DOCUMENTS

| 5,444,270 | 8/1995 | Cunningham et al. | 257/98 |
| 5,523,555 | 6/1996 | Friend et al. | 250/214 |
| 5,559,400 | 9/1996 | Nakayama et al. | 313/506 |

OTHER PUBLICATIONS

G. Yu et al., "Dual–function Semiconducting Polymer Devices: Lightemitting and Photodetecting Diodes", 1994 American Institute of Physics, Mar. 21, 1994, pp. 1540–1542.

G. Yu et al., "Semiconducting Polymer Diodes: Large Size, Low Cost Photodetectors with Excellent Visible–Ultraviolet Sensitivity", 1994 American Institute of Physics, Jun. 20, 1994, pp. 3422–3424.

*Primary Examiner*—Edward P. Westin
*Assistant Examiner*—Thanh X. Luu
*Attorney, Agent, or Firm*—Jacobson, Price, Holman & Stern, PLLC.

[57] ABSTRACT

A polymer photodetector includes a resonant wavelength controller which resonates an optical beam with a particular wavelength only from the incident optical beam received thereinto through the rear surface of the reflection layer, so as to selectively detect the optical beam with the particular wavelength. The resonant wavelength controller includes a fixed mirror layer, a movable mirror layer, and an air layer disposed therebetween. The resonant wavelength can be adjusted by varying an optical length between the movable mirror layer and the fixed mirror layer. The optical length can be adjusted by varying the thickness of the air layer between the movable mirror layer and the fixed mirror layer by way of adjusting the electrostatic force.

4 Claims, 2 Drawing Sheets

POLYMER PHOTODETECTOR HAVING RESONANT WAVELENGTH CONTROL FUNCTION

BACKGROUND OF THE INVENTION

1. Field of the Invention

The present invention relates to a polymer photodetector, and more particularly a polymer photodetector capable of controlling a resonant wavelength by way of adjusting an electrostatic force.

2. Description of the Related Art

A conventional polymer photodetector has been unnoticeable because of its a low electron/photon conversion efficiency ($10^{-3}$ electron/photon). However, the polymer photodetector has aroused an interest, since a recent development of an element with ITO/MEH-PPV/Ca structure having the electron/photon conversion efficiency of about 20%. Such polymer photodetector is suitably applicable to a field of spectroscopy, because it has a feature of a uniform response at a relatively wide wavelength region. The conventional polymer photodetector having such advantage, which is formed on a transparent substrate fundamentally, includes a photodetecting layer disposed between a transparent electrode and an opaque electrode. However, in the case where an incident optical beam consists bf various wavelengths, it is almost impossible for the conventional polymer photodetector to properly detect an intensity of the incident optical beam according to the wavelength.

SUMMARY OF THE INVENTION

It is therefore an object of the present invention to provide a polymer photodetector including a resonant wavelength controller for controlling a resonant wavelength by way of adjusting an electrostatic force, so as to properly detect an intensity of an optical beam according to the wavelength, at an ultraviolet ray region and a visible ray region.

According to an aspect of the present invention, a polymer photodetector includes a lower electrode being transparent at an ultraviolet ray region and a visible ray region, a polymer photodetecting layer formed on the lower electrode, and an opaque upper electrode and a detected wavelength control means, formed on the photodetecting layer.

The detected wavelength control means includes a reflection layer formed on a transparent substrate, a fixed electrode formed on the reflection layer, a resonator supporting layer and an air layer, formed on the fixed electrode, and an electrostatic force control means connected between the fixed electrode and a movable electrode formed on the resonator supporting layer and the air layer. The photodetecting layer comprises conjugated polymer. The reflection layer comprises two sorts of dielectric thin layers with different refractive indexes being periodically stacked on the transparent substrate.

BRIEF DESCRIPTION OF THE DRAWINGS

The above and other objects, features and advantages of the present invention will become more apparent in the light of the following detailed description of an exemplary embodiment thereof taken with the attached drawings in which.

DETAILED DESCRIPTION OF THE PREFERRED EMBODIMENT

Figure 1:
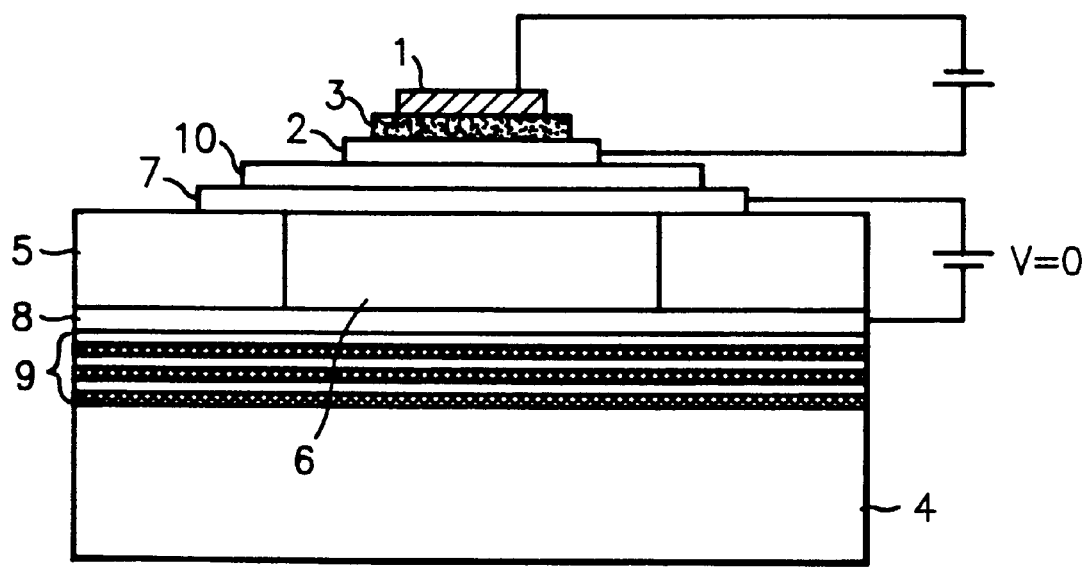
FIG. 1 is a cross-sectional view of a polymer photodetector according to a preferred embodiment of the present invention.

A preferred embodiment of the present invention will be described in detail hereinbelow with reference to the attached drawings, wherein the like reference numerals represent the like elements.

Referring to FIG. 1, there is illustrated a polymer photodetector including a detected wavelength control function according to a preferred embodiment of the present invention. As illustrated, the photodetection is accomplished by a photodetecting section comprised of an opaque electrode 1, a transparent electrode 2 and a polymer photodetecting layer 3 interposed between the electrodes 1 and 2. The opaque electrode 1 serves as a mirror of a resonator. The transparent electrode 2 becomes transparent at an ultraviolet ray region and a visible ray region. The photodetecting layer 3 is composed of a material generating electrons upon being exposed to the ultraviolet ray and the visible ray. A conjugated polymer having a feature of the semiconductor is used for such material.

A resonant wavelength controller includes an air layer 6 formed by a detector supporting layer 5, a movable electrode 7, and a fixed layer 8, so as to accomplish a detected wavelength control. The movable electrode 7 and the fixed electrode 8 of the resonant wavelength controller are all transparent at the ultraviolet ray region and the visible ray region. The movable electrode 7 is electrically isolated from the transparent electrode 2 by means of a transparent resonator supporting layer 10, and a polarity of the electrode does not influence the operation thereof at all. The movable electrode 7 is movable, together with the photodetecting section, perpendicularly to the surface of a substrate 4.

Furthermore, a resonant condition is determined by a reflexibility of the opaque metal electrode 1 and a reflection layer 9, and an optical length of the air layer 6, the movable electrode 7, the fixed electrode 8, the detector supporting layer 10, and the photodetecting layer 3. Here, the optical length is obtained by multiplying a physical thickness by a refractive index. Namely, it is possible to control the resonant wavelength by adjusting the optical length that can be controlled by way of adjusting the thickness of the air layer 6. The thickness of the air layer 6 is determined by an electrostatic force between the transparent movable electrode 7 and the transparent fixed electrode 8, and an elasticity of the materials composing the transparent movable electrode 7. The electrostatic force F between the transparent movable electrode 7 and the transparent fixed electrode 8 can be represented by, $$F = \in AV^2/2d$$

where $\in$ a dielectric constant, A is an area of the electrode, and V and d are a voltage and a distance between the transparent electrodes, respectively. When the elasticity of the materials composing the transparent movable electrode 7 and the detector supporting layer 10 keeps in equilibrium with the above electrostatic force F, the optical length can be controlled by adjusting a voltage between the transparent movable electrode 7 and the transparent fixed electrode 8.

The reflection layer 9 has a distributed Bragg reflector (DBR) structure or chirped DBR structure in which two sorts of dielectric thin layers each having different refractive indexes are periodically (or alternately) stacked on the transparent substrate 4. The detected optical beam is irradiated into the resonator through the transparent substrate 4.

Figure 2:
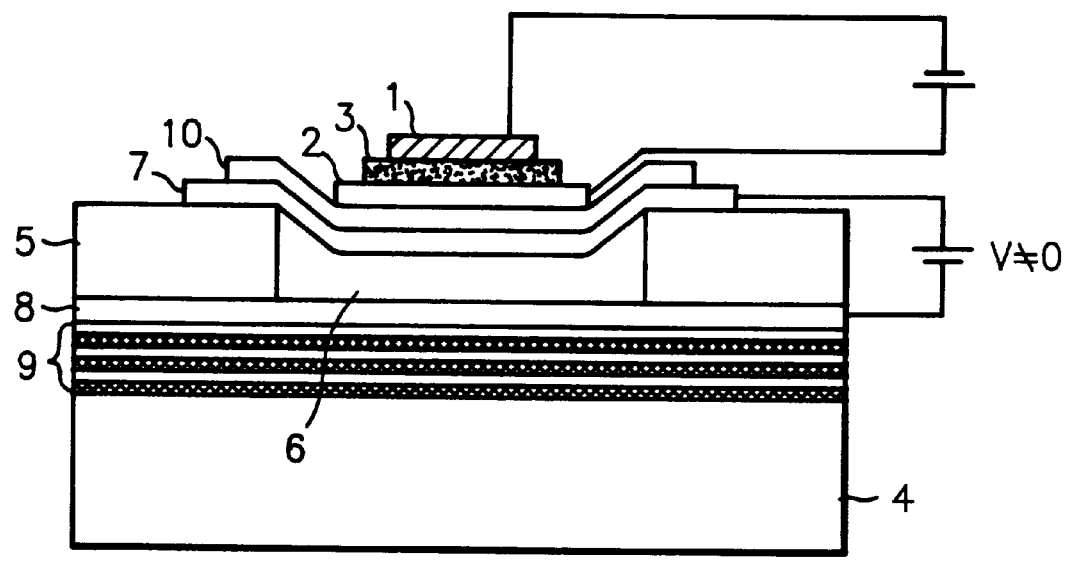
FIG. 2 is a cross-sectional view of a polymer photodetector showing an operational status thereof when a voltage is supplied to a movable electrode according to a preferred embodiment of the present invention.

Referring to FIG. 2, there is illustrated an operational situation of the polymer photodetector showing that the thickness of the air layer 6 is reduced, when a voltage is applied between the transparent movable electrode 7 and the transparent fixed electrode 8 (i.e., V≠0). A variation of the thickness of the air layer 6 according to the voltage is determined by the elasticity of a material composing the transparent movable electrode 7 and the photodetecting section which is an electric field emitting section.

An adjusting section connected to the photodetector has a structure for controlling the resonant wavelength by way of adjusting the electrostatic force F.

As described in the foregoing descriptions, the present invention is directed to a polymer photodetector including a resonant wavelength control function, in which a resonant wavelength controller resonates an optical beam with a particular wavelength only from the incident optical beam received thereinto through the rear surface of the reflection layer, so as to selectively detect the optical beam with the particular wavelength. The resonant wavelength controller includes a fixed mirror layer, a movable mirror layer, and an air layer disposed therebetween. The resonant wavelength can be adjusted by varying an optical length between the movable mirror layer and the fixed mirror layer. The optical length can be adjusted by varying the thickness of the air layer between the movable mirror layer and the fixed mirror layer by way of adjusting the electrostatic force.

As described heretofore, the photodetector according to the present invention has a feature capable of controlling the detected wavelength by way of adjusting the resonant wavelength. Therefore, when applied to spectroscopy, it may be possible to detect various wavelengths with use of only one detector. Namely, it is possible to detect an intensity of the optical beam according to the wavelength. Further, since the resonator serves as an amplifier, the photodetector according to the present invention has an improved sensitivity, compared with the conventional photodetector which does not include the resonator.

Although a preferred embodiment of the present invention has been described in detail hereinabove, it should be clearly understood that many variations and/or modifications of the basic inventive concepts herein taught which may appear to those skilled in the art will still fall within the spirit and scope of the present invention as defined in the appended claims.

What is claimed is:

1. A polymer photodetector comprising:

a lower electrode being transparent at an ultraviolet ray region and a visible ray region;

a polymer photodetecting layer formed on said lower electrode;

an opaque electrode formed on said photodetecting layer; and a wavelength detecting control means formed beneath said lower electrode.

2. A polymer photodetector according to claim 1, wherein said wavelength detecting control means comprises:

a reflection layer formed on a transparent substrate;

a fixed electrode formed on said reflection layer;

a resonator supporting layer and an air layer, formed on said fixed electrode; and an electrostatic force control means connected between said fixed electrode and a movable electrode formed on said resonator supporting layer and said air layer.

3. A polymer photodetector according to claim 1 wherein said photodetecting layer comprises conjugated polymer.

4. A polymer photodetector according to claim 2, wherein said reflection layer comprises two sorts of dielectric thin layers with different refractive indexes being periodically stacked on said transparent substrate.

\* \* \* \* \*